United States Patent
Wang et al.

(10) Patent No.: US 8,538,572 B2
(45) Date of Patent: Sep. 17, 2013

(54) METHODS FOR CONSTRUCTING AN OPTIMAL ENDPOINT ALGORITHM

(75) Inventors: Jiangxin Wang, Fremont, CA (US); Andrew James Perry, Canberra (AU); Vijayakumar C Venugopal, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 360 days.

(21) Appl. No.: 12/826,564

(22) Filed: Jun. 29, 2010

(65) Prior Publication Data

US 2010/0330710 A1    Dec. 30, 2010

Related U.S. Application Data

(63) Continuation-in-part of application No. 12/555,674, filed on Sep. 8, 2009.

(60) Provisional application No. 61/222,102, filed on Jun. 30, 2009, provisional application No. 61/222,024, filed on Jun. 30, 2009.

(51) Int. Cl.
  *G06F 19/00* (2011.01)
  *G05B 13/02* (2006.01)
  *H01L 21/00* (2006.01)
  *G06F 15/00* (2006.01)

(52) U.S. Cl.
  USPC ...... 700/110; 438/8; 438/9; 700/33; 700/121; 712/205

(58) Field of Classification Search
  USPC ............... 700/33, 110, 121; 712/205; 438/8, 438/9
  See application file for complete search history.

(56) References Cited

U.S. PATENT DOCUMENTS

| 4,310,880 A | 1/1982 | Gehman |
| 4,443,848 A | 4/1984 | Gehman |

(Continued)

FOREIGN PATENT DOCUMENTS

| JP | 2003-197609 A | 7/2003 |
| KR | 10-2005-0030342 A | 3/2005 |

(Continued)

OTHER PUBLICATIONS

"International Preliminary Report on Patentability", PCT Application No. PCT/US2010/042933, Mailing Date: Jan. 12, 2012.

(Continued)

*Primary Examiner* — Kavita Padmanabhan
*Assistant Examiner* — Thomas Stevens
(74) *Attorney, Agent, or Firm* — IPSG, P.C. Intellectual Property Law (57) ABSTRACT

A method for automatically identifying an optimal endpoint algorithm for qualifying a process endpoint during substrate processing within a plasma processing system is provided. The method includes receiving sensor data from a plurality of sensors during substrate processing of at least one substrate within the plasma processing system, wherein the sensor data includes a plurality of signal streams from a plurality of sensor channels. The method also includes identifying an endpoint domain, wherein the endpoint domain is an approximate period within which the process endpoint is expected to occur. The method further includes analyzing the sensor data to generate a set of potential endpoint signatures. The method yet also includes converting the set of potential endpoint signatures into a set of optimal endpoint algorithms. The method yet further includes importing one optimal endpoint algorithm of the set of optimal endpoint algorithms into production environment.

15 Claims, 6 Drawing Sheets

(56) References Cited

U.S. PATENT DOCUMENTS

| | | | |
|---|---|---|---|
| 4,659,413 A * | 4/1987 | Davis et al. | 156/345.24 |
| 4,661,196 A * | 4/1987 | Hockersmith et al. | 156/345.31 |
| 4,785,399 A * | 11/1988 | Evans et al. | 715/810 |
| 5,206,184 A * | 4/1993 | Allen et al. | 438/587 |
| 5,272,872 A | 12/1993 | Grutter et al. | |
| 5,450,205 A * | 9/1995 | Sawin et al. | 356/632 |
| 5,479,340 A | 12/1995 | Fox et al. | |
| 5,640,518 A | 6/1997 | Muhich et al. | |
| 5,971,591 A | 10/1999 | Vona et al. | |
| 5,986,747 A * | 11/1999 | Moran | 356/72 |
| 6,021,215 A * | 2/2000 | Kornblit et al. | 382/141 |
| 6,077,386 A * | 6/2000 | Smith et al. | 156/345.24 |
| 6,192,287 B1 | 2/2001 | Solomon et al. | |
| 6,246,481 B1* | 6/2001 | Hill | 356/487 |
| 6,253,113 B1 | 6/2001 | Lu | |
| 6,318,384 B1* | 11/2001 | Khan et al. | 134/22.1 |
| 6,332,961 B1 | 12/2001 | Johnson et al. | |
| 6,343,251 B1 | 1/2002 | Herron et al. | |
| 6,377,210 B1 | 4/2002 | Moore | |
| 6,420,194 B1* | 7/2002 | Reitman | 438/9 |
| 6,553,277 B1 | 4/2003 | Yagisawa et al. | |
| 6,567,718 B1 | 5/2003 | Campbell et al. | |
| 6,665,576 B2 | 12/2003 | Hayashi | |
| 6,745,096 B2 | 6/2004 | Yamamoto et al. | |
| 6,805,810 B2* | 10/2004 | Smith et al. | 216/60 |
| 6,813,534 B2 | 11/2004 | Sui et al. | |
| 6,821,794 B2* | 11/2004 | Laursen et al. | 438/8 |
| 6,824,627 B2 | 11/2004 | Dhindsa et al. | |
| 6,879,867 B2 | 4/2005 | Tanaka et al. | |
| 6,895,293 B2 | 5/2005 | Reiss et al. | |
| 6,902,646 B2 | 6/2005 | Mahoney | |
| 6,969,619 B1 | 11/2005 | Winniczek | |
| 7,010,374 B2 | 3/2006 | Tanaka et al. | |
| 7,016,811 B2 | 3/2006 | Peck et al. | |
| 7,050,873 B1 | 5/2006 | Discenzo | |
| 7,058,467 B2 | 6/2006 | Tanaka et al. | |
| 7,062,411 B2 | 6/2006 | Hopkins et al. | |
| 7,082,345 B2 | 7/2006 | Shanmugasundram et al. | |
| 7,103,443 B2 | 9/2006 | Strang | |
| 7,107,115 B2 | 9/2006 | Tanaka et al. | |
| 7,113,838 B2 | 9/2006 | Funk et al. | |
| 7,123,980 B2 | 10/2006 | Funk et al. | |
| 7,146,237 B2 | 12/2006 | Lev-Ami et al. | |
| 7,158,848 B2 | 1/2007 | Tanaka et al. | |
| 7,167,766 B2 | 1/2007 | Lam et al. | |
| 7,217,336 B2 | 5/2007 | Strang | |
| 7,257,457 B2 | 8/2007 | Imai et al. | |
| 7,356,580 B1 | 4/2008 | Huang et al. | |
| 7,373,216 B1 | 5/2008 | Winkler et al. | |
| 7,376,479 B2 | 5/2008 | Tanaka et al. | |
| 7,413,672 B1 | 8/2008 | Keil et al. | |
| 7,477,960 B2 | 1/2009 | Willis et al. | |
| 7,493,185 B2 | 2/2009 | Cheng et al. | |
| 7,499,897 B2 | 3/2009 | Pinto et al. | |
| 7,531,368 B2 | 5/2009 | Winkler et al. | |
| 7,565,220 B2 | 7/2009 | Huang et al. | |
| 7,620,511 B2 | 11/2009 | Shannon et al. | |
| 7,647,237 B2 | 1/2010 | Malave et al. | |
| 7,668,615 B2 | 2/2010 | Goff et al. | |
| 7,672,747 B2 | 3/2010 | Huang et al. | |
| 7,676,295 B2 | 3/2010 | Weetman | |
| 7,713,758 B2 | 5/2010 | Yamashita et al. | |
| 7,729,795 B2 | 6/2010 | Winkler et al. | |
| 7,793,162 B2 | 9/2010 | Mock et al. | |
| 7,805,639 B2 | 9/2010 | Mock et al. | |
| 7,829,468 B2 | 11/2010 | Keil et al. | |
| 7,835,814 B2 | 11/2010 | Mock et al. | |
| 7,842,519 B2 | 11/2010 | Winkler et al. | |
| 7,848,898 B2 | 12/2010 | Shannon et al. | |
| 7,864,502 B2 | 1/2011 | Boyd et al. | |
| 7,886,046 B1 | 2/2011 | Zeitoun et al. | |
| 7,939,450 B2 | 5/2011 | Yamashita et al. | |
| 7,967,995 B2 | 6/2011 | Funk et al. | |
| 8,000,827 B2 | 8/2011 | Weetman et al. | |
| 8,005,562 B2 | 8/2011 | Baek et al. | |
| 8,014,991 B2 | 9/2011 | Mitrovic et al. | |
| 8,032,348 B2 | 10/2011 | Mitrovic et al. | |
| 8,036,869 B2 | 10/2011 | Strang et al. | |
| 8,050,900 B2 | 11/2011 | Mitrovic et al. | |
| 8,073,667 B2 | 12/2011 | Strang et al. | |
| 8,140,719 B2 | 3/2012 | Lauterbach et al. | |
| 2002/0177917 A1 | 11/2002 | Polla et al. | |
| 2003/0087459 A1* | 5/2003 | Laursen et al. | 438/8 |
| 2003/0223055 A1 | 12/2003 | Agarwal et al. | |
| 2003/0226821 A1* | 12/2003 | Huang et al. | 216/59 |
| 2004/0004708 A1 | 1/2004 | Willis | |
| 2004/0031052 A1 | 2/2004 | Wannamaker et al. | |
| 2004/0055868 A1 | 3/2004 | O'Leary et al. | |
| 2004/0117054 A1* | 6/2004 | Gotkis et al. | 700/121 |
| 2004/0175880 A1 | 9/2004 | Tanaka et al. | |
| 2004/0254762 A1 | 12/2004 | Hopkins et al. | |
| 2005/0055175 A1 | 3/2005 | Jahns et al. | |
| 2005/0071034 A1 | 3/2005 | Mitrovic | |
| 2005/0071035 A1 | 3/2005 | Strang | |
| 2005/0071036 A1 | 3/2005 | Mitrovic | |
| 2005/0071037 A1 | 3/2005 | Strang | |
| 2005/0071038 A1 | 3/2005 | Strang | |
| 2005/0071039 A1 | 3/2005 | Mitrovic | |
| 2005/0084988 A1 | 4/2005 | Huang et al. | |
| 2005/0130125 A1 | 6/2005 | Zagyansky | |
| 2005/0159911 A1 | 7/2005 | Funk et al. | |
| 2005/0171627 A1 | 8/2005 | Funk et al. | |
| 2005/0234574 A1 | 10/2005 | Lam et al. | |
| 2006/0049831 A1 | 3/2006 | Anwar et al. | |
| 2006/0144335 A1 | 7/2006 | Lee et al. | |
| 2006/0171848 A1 | 8/2006 | Roche et al. | |
| 2006/0180570 A1 | 8/2006 | Mahoney | |
| 2006/0184264 A1 | 8/2006 | Willis et al. | |
| 2006/0287753 A1* | 12/2006 | Plumhoff | 700/121 |
| 2007/0050076 A1 | 3/2007 | Yamazaki et al. | |
| 2007/0110043 A1 | 5/2007 | Girard | |
| 2007/0226540 A1 | 9/2007 | Konieczny | |
| 2008/0061793 A1 | 3/2008 | Anwar et al. | |
| 2008/0082579 A1 | 4/2008 | Huang et al. | |
| 2008/0082653 A1 | 4/2008 | Huang et al. | |
| 2008/0208487 A1 | 8/2008 | Goebel et al. | |
| 2008/0243988 A1 | 10/2008 | Huang et al. | |
| 2009/0216920 A1 | 8/2009 | Lauterbach et al. | |
| 2009/0242513 A1 | 10/2009 | Funk et al. | |
| 2010/0125360 A1 | 5/2010 | Huang et al. | |
| 2010/0198556 A1 | 8/2010 | Kost | |
| 2010/0332013 A1 | 12/2010 | Choi et al. | |
| 2010/0332014 A1 | 12/2010 | Albarede et al. | |
| 2012/0101622 A1 | 4/2012 | Yun et al. | |

FOREIGN PATENT DOCUMENTS

| | | |
|---|---|---|
| KR | 10-2008-0006750 A | 1/2008 |
| WO | WO-2004/102642 A2 | 11/2004 |

OTHER PUBLICATIONS

"International Preliminary Report on Patentability", PCT Application No. PCT/US2010/040456, Mailing Date: Jan. 12, 2012.
"International Preliminary Report on Patentability", PCT Application No. PCT/US2010/040465, Mailing Date: Jan. 12, 2012,.
"International Preliminary Report on Patentability", PCT Application No. PCT/US2010/040468, Mailing Date: Jan. 12, 2012.
"International Preliminary Report on Patentability", PCT Application No. PCT/US2010/040477, Mailing Date: Jan. 12, 2012.
"International Preliminary Report on Patentability", PCT Application No. PCT/US2010/040478, Mailing Date: Jan. 12, 2012.
"International Search Report", Issued in PCT Application No. PCT/US2010/040456; Mailing Date: Jan. 21, 2011.
"Written Opinion", Issued in PCT Application No. PCT/US2010/040456; Mailing Date: Jan. 21, 2011.
"International Search Report", Issued in PCT Application No. PCT/US2010/040465; Mailing Date: Jan. 17, 2011.
"Written Opinion", Issued in PCT Application No. PCT/US2010/040465; Mailing Date: Jan. 17, 2011.
"International Search Report", Issued in PCT Application No. PCT/US2010/040468; Mailing Date: Jan. 17, 2011.
"Written Opinion", Issued in PCT Application No. PCT/US2010/040468; Mailing Date: Jan. 17, 2011.

"International Search Report", Issued in PCT Application No. PCT/US2010/040477; Mailing Date: Feb. 8, 2011.
"Written Opinion", Issued in PCT Application No. PCT/US2010/040477; Mailing Date; Feb. 8, 2011.
"International Search Report", Issued in PCT Application No. PCT/US2010/042933; Mailing Date: Feb. 18, 2011.
"Written Opinion", Issued in PCT Application No. PCT/US2010/042933; Mailing Date: Feb. 18, 2011.
"International Search Report", Issued in PCT Application No. PCT/US2010/040478; Mailing Date; Dec. 28, 2010.
"Written Opinion", Issued in PCT Application No. PCT/US2010/040478; Mailing Date: Dec. 28, 2010.
"Non-Final Office Action", U.S. Appl. No. 12/555,674, Mailing Date: Sep. 4, 2012, 12 pages.
"Non Final Office Action", U.S. Appl. No. 12/826,568, Mailing Date: Nov. 9, 2012, 19 pages.
"Final Office Action", U.S. Appl. No. 12/826,575, Mailing Date: Oct. 22, 2012, 8 pages.

* cited by examiner

METHODS FOR CONSTRUCTING AN OPTIMAL ENDPOINT ALGORITHM

CROSS REFERENCE TO RELATED APPLICATIONS

The present invention claims priority under 35 U.S.C. 119(e) to a commonly owned provisionally filed patent application entitled "Methods and Systems for Advance Equipment Control/Advance Process Control for Plasma Processing Tools," U.S. Application No. 61/222,102, filed on Jun. 30, 2009, by inventors Venugopal et al., all of which is incorporated herein by reference.

This continuation-in-part application claims priority under 37 CFR 1.53(b) of and claims the benefit under 35 U.S.C. §120 to a commonly assigned patent application entitled "Arrangement for Identifying Uncontrolled Events at the Process Module Level and Methods Thereof," by Huang et al., application Ser. No. 12/555,674 filed on Sep. 8, 2009, which is related to and claims priority under 35 U.S.C. §119(e) to a commonly assigned provisional patent application entitled "Arrangement for Identifying Uncontrolled Events at the Process Module Level and Methods Thereof," by Huang et al., Application Ser. No. 61/222,024, filed on Jun. 30, 2009, all of which is incorporated by reference herein.

BACKGROUND OF THE INVENTION

For ease of discussion, a few terms have been defined below.

Data set—a record of measurements as a function of time for a parameter on the processing tool.

Change point—a point in a time series at which some change occurs

Endpoint—a point in time at which a process (e.g., etching of a silicon layer) has reached or is near completion.

Endpoint domain—an interval in a data set during which an endpoint is thought to occur. An endpoint domain is usually relatively broad and is based on user estimate.

Partial Least Squares Discriminant Analysis (PLS-DA)—a technique for finding relationships between two sets of data. PLS-DA may be used when there are multiple independent variables (in an input matrix X) and possibly multiple dependent variables (in an input matrix Y). In PLS-DA, the Y variables are not continuous but consist of a set of independent discrete values or classes. PLS-DA may try to find linear combinations of the X variables that can be used to classify the input data into one of the discrete classes.

Pre-endpoint domain—a part of the data set that precedes the endpoint domain.

Post-endpoint domain—a part of the data set that comes after the endpoint domain.

Signature—a distinctive change point (or combination of change points) in the evolution of a parameter or combination of parameters which indicates an endpoint in a process. The combination of parameters and the nature of the change usually form part of a signature.

Stepwise regression—refers to fitting a straight line using a least-squares fitting algorithm to the data values in a finite temporal interval of the data from an individual sensor channel.

Advances in plasma processing have provided for growth in the semiconductor industry. To gain a competitive advantage, semiconductor device manufacturers need to maintain tight control of the processing environment in order to minimize waste and produce high quality semiconductor devices.

One method for maintaining tight control is by identifying a process endpoint. As discussed herein, the term endpoint refers to a point in time at which a process (e.g., etching a silicon layer) has reached or is near completion. The process of identifying an endpoint may be as simple as identifying a signal with the largest change. However, a signal change may not always coincide with an endpoint. Other factors, such as noise in the channel, may cause the signal pattern to change.

Figure 1:
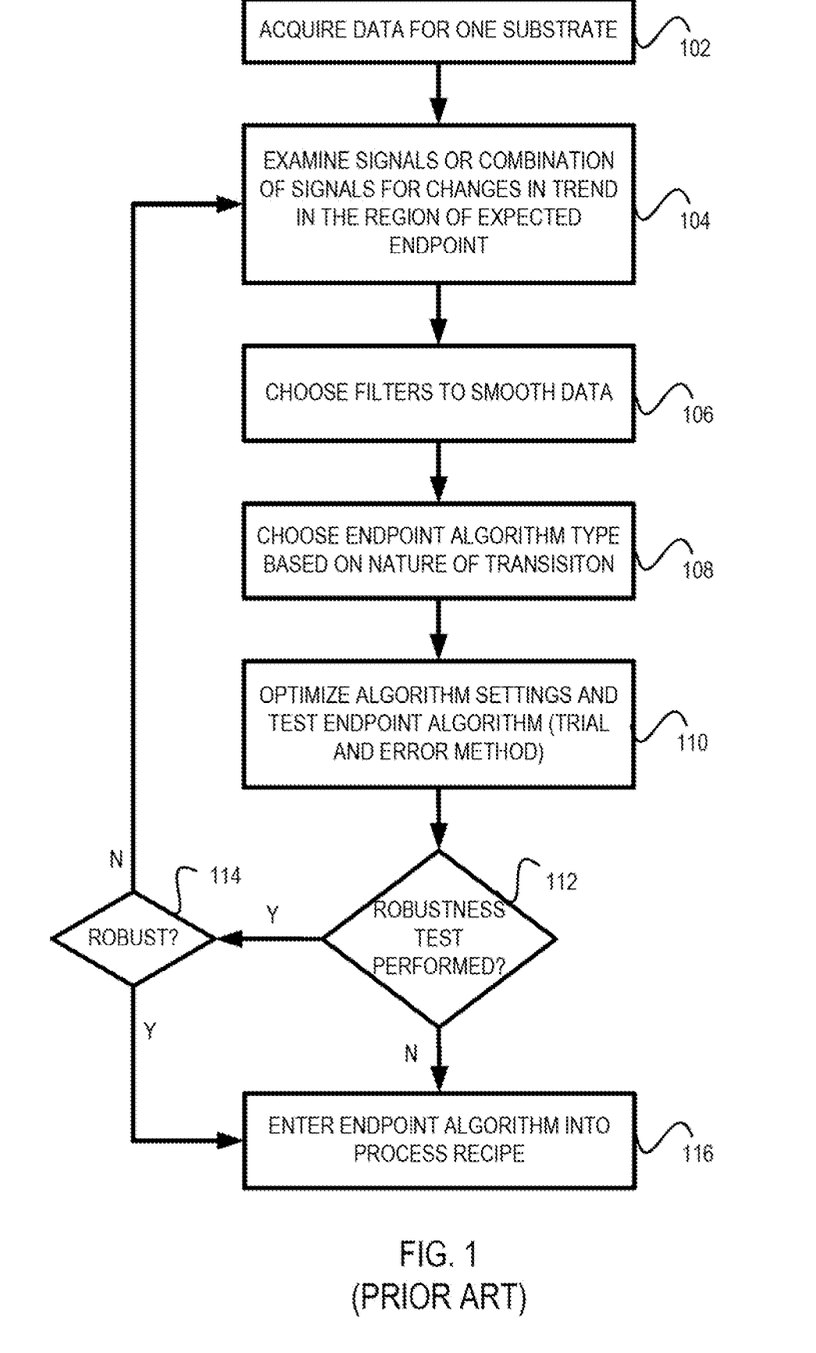
FIG. 1 shows a simple method for establishing an endpoint algorithm.

To facilitate discussion, FIG. 1 shows a simple method for establishing an endpoint algorithm. The method as described in FIG. 1 is usually performed manually by an expert user, for example.

Consider the situation wherein, for example, a test substrate is being processed. Since there are different types of substrates, the test substrate tends to be of the same type as the substrate that may be utilized in a production environment. For example, if a specific patterned substrate is utilized during production, a similar patterned substrate may be employed as a test substrate.

At a first step 102, data is acquired for a substrate. In an example, sensors (such as a pressure manometer, an optical emission spectrometer (OES), a temperature sensor, and the like) acquire data while the substrate is processed. Data for hundreds, if not thousands, of sensor channels may be collected.

After the substrate has been processed, the data that has been collected may be analyzed. Since a plethora of data may be available, finding an endpoint within thousands of signal streams may be a challenging task that usually requires in-depth knowledge of the tool and recipe. For this reason, an expert user is usually charged with the task of performing the analysis.

At a next step 104, an expert user may examine one or more signals for changes in the signal patterns. The expert user may employ one or more software programs to assist with the analysis. In an example, the software program may be a simple analysis tool that may perform simple calculations and analysis. In another example, the software program may be a simple data visualization program that may be employed to graphically illustrate a signal history, for example.

However, even with the expert user's expertise and experience, the volume of data acquired by the sensors and available for analysis may be overwhelming. Accordingly, the task of identifying an endpoint signature can be a daunting task. In an example, there may be over 2,000 wavelength measurements within an OES sensor channel. Since endpoint data may also be found in other sensor channels (such as sensor channels providing data about temperature, pressure, voltage, and the like), an expert user may be facing an insurmountable task if every signal and combination of signals has to be analyzed.

As can be expected, depending upon applications, some signals may provide better endpoint data than other signals. For example, both signals A and B have endpoint data. However, signal B may provide a better endpoint signature since signal B may have less noise than signal A. Given that there may be dozens or hundreds of signals, the task of analyzing the data set for an endpoint signature, much less an optimal endpoint signature, may become a very tedious and time-consuming process.

In analyzing the data, the expert user may be looking for a signal change (e.g., change in a signal pattern) as an indication of an endpoint. For example, if a signal is sloping downward, a peak in the signal slope may represent a change. Although the task of manually identifying a signal change has been a tedious task in the past, in recent years, this task has become even more difficult as signal changes become less obvious. This is especially true for recipes that are employed to process small open areas on a substrate. In an example, an open area that is being processed (e.g., etched) is so small (e.g., <1% of the substrate area) that a signal change is so subtle so as to be almost unnoticeable to the human eyes.

To facilitate analysis, the expert user may eliminate data values that he believes to be not relevant in identifying an endpoint. One method for reducing the data set includes identifying and eliminating regions in the signal stream within which the expert user does not expect the endpoint to occur. In other words, the expert user may limit his search for an endpoint to a target area in the signal stream, usually between a pre-endpoint domain and a post-endpoint domain. Because of the high cost (in expert time) of finding and refining endpoint signatures, the aim is to make the pre-endpoint and post-endpoint domains as large as possible to limit the region left in which to look for endpoint.

Since the expert user is usually familiar with the process, the expert user may further reduce the data set by only analyzing select signals. The select signals may include signals or combination of signals that, based on the expert user's experience, may contain endpoint data. Typically, when a combination of signals is being analyzed as a group, the combination of signals is usually from a single sensor source. Generally, data from different sensor sources are not combined since variations between the sensors may make the correlation analysis difficult, if not impossible, to be performed manually.

As can be expected, working only with a filtered data set may increase the risk of the optimal endpoint signature being inadvertently eliminated. In other words, by filtering out the data, the expert user may be making an assumption that an endpoint signature, much less the optimal endpoint signature, is located in one of the signals that remains after filtering. For this reason, the endpoint signature that may be identified in the remaining signals may not necessarily be the optimal endpoint signature.

After a signal change has been identified, the expert user may perform a verification analysis to determine the robustness of the signal change as an endpoint candidate. For example, the expert user may analyze the history of the signal to determine the uniqueness of the signal change. If the signal change is not unique (i.e., occurring more than once in the history of the signal), the signal may be eliminated from the data set. The expert user may then resume his tedious task of identifying the "elusive" endpoint in another signal.

At a next step 106, a set of filters (such as a set of digital filters) may be applied to the data set to remove noise and smooth out the data. Examples of filters that may be applied include, but are not limited to, for example, time series filters and frequency-based filters. Although applying filters to a data set may decrease noise in the data set, filters are usually applied sparingly since filters may also increase the real-time delay within a signal.

In some situations, a multi-variate analysis (such as Principal Component Analysis or Partial Least Squares) may be performed in analyzing the data. The multi-variate analysis may be performed to further reduce the data set. In order to utilize the multi-variate analysis, the expert user may be required to define the shape (e.g., curve) of an endpoint feature. In other words, the expert user is expected to anticipate the shape of the endpoint even though an endpoint candidate may have yet to be identified. By predefining the shape of the endpoint, the multi-variate analysis essentially eliminates signals that do not exhibit the desired shape. In an example, if the shape of the endpoint is defined to be a peak, signals that do not exhibit this shape may be eliminated. Accordingly, if the optimal endpoint signature does not have the "expected" shape, the optimal endpoint signature may be missed.

As can be appreciated from the foregoing, the task of identifying a single endpoint signature from a plethora of data can be a daunting task and may take hours, if not weeks, to perform. Further, once an endpoint signature is identified, little or no quantitative analysis of the suitability of the signals or combination of signals as an endpoint signature may be performed. In an example, to validate a signal change as an endpoint signature, the expert user may analyze other signals to look for a similar signal change at around the same time frame. However, given that the expert user may have already spent a considerable amount of time identifying the first endpoint signature, the expert user may not always have the time, resource and/or inclination to validate the result.

At a next step 108, the expert user may choose an endpoint algorithm type based on the nature of the transition. Usually, the endpoint algorithm type may be based on the shape of the spectral line(s), for example, that may represent the endpoint. In an example, the endpoint may be represented by a slope change. Accordingly, the expert user may propose a slope dependent algorithm.

In addition, the endpoint algorithm may be based on the derivative that may provide the best endpoint signature. However, the first derivative (such as a change in the slope) of the endpoint signature may not provide the best endpoint algorithm. Instead, the second derivative of the slope (such as an inflection point), for example, may provide a better endpoint algorithm. The ability to identify not only an endpoint signature but also the best endpoint algorithm associated with the endpoint signature may require expertise that few users (even expert users) may possess.

At a next step 110, the algorithm settings may be optimized and/or tested. Once the endpoint algorithm has been identified, the endpoint algorithm may be converted into a production endpoint algorithm. Since differences may exist between the test environment and the production environment, the setting of the endpoint algorithm may have to be adjusted before the endpoint algorithm may be moved into production. Settings that may be adjusted include but are not limited to, for example, smoothing filters, delay time, specific settings for the algorithm types, and the like.

In an example, filters that may be employed to smooth the data in a test environment may cause unacceptable real-time delay within a production environment. As discussed herein, real-time delay refers to the time difference between a non-filtered signal change and a filtered signal change. For example, a peak in a signal may have occurred at 40 seconds into the process. However, after a filter is applied, the peak may not occur until 5 seconds later. If an endpoint algorithm is applied with the filter settings, the substrate may be over-etched before the endpoint algorithm identifies the endpoint. To minimize the real-time delay, the filters may have to be adjusted.

Before moving the endpoint algorithm into production, a test may be performed to determine if the settings have been optimized. In an example, the endpoint algorithm may be applied to the data set that has been utilized to create the endpoint algorithm. If the endpoint algorithm correctly identifies the endpoint using the adjusted settings, the settings may be considered as optimized. However, if the endpoint algorithm fails to correctly identify the endpoint, the settings may have to be adjusted. This test may have to be performed multiple times (through a trial and error method) before the settings may even be optimized.

At a next step 112, a determination is made in regard to performing a robustness test on the endpoint algorithm. If a robustness test is performed (step 114), the endpoint algorithm may be applied to data sets associated with other substrates. In an example, a second test substrate may be processed and data may be collected. The endpoint algorithm may then be applied to the second data set. If the endpoint algorithm is able to identify the endpoint, the endpoint algorithm may be considered robust and the endpoint algorithm may be migrated into production (step 116). However, if the endpoint algorithm fails to identify the endpoint, the endpoint algorithm may be considered to be not sufficiently robust and the expert user may return to step 104 to resume the task of identifying another endpoint candidate and constructing another endpoint algorithm.

Given that the robustness test may require time for execution and analysis, many endpoint algorithms may be migrated into the production environment without undergoing the robustness test. In other words, step 112 is usually considered as an optional step in the creation of an endpoint algorithm.

As can be appreciated from FIG. 1, the method for creating an endpoint algorithm is mostly a manual process that is usually performed by experts who may have the expertise and experience to perform the complex analysis. Given the restraint on resources, the endpoint algorithm that may be moved into production may lack quantitative support. Further, since a single human can not possibly analyze all signals and/or combination of signals within a reasonable period of time, the endpoint algorithm that may be created may not always be the optimal endpoint algorithm for the process.

Accordingly, a simplified method for constructing a robust endpoint algorithm is desirable.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In accordance with embodiments of the invention, methods are provided for automatically discovering and optimizing endpoint algorithms. Embodiments of the invention include methods for constructing an endpoint algorithm for determining an optimal endpoint for a process. Embodiments of the invention also include in-situ methods for applying the endpoint algorithm within a production environment.

In this document, various implementations may be discussed using endpoint as an example. This invention, however, is not limited to endpoint and may include any change point that may occur during a process. Thus, the discussions are meant as examples and the invention is not limited by the examples presented.

In an embodiment of the invention, methods are provided for constructing an endpoint algorithm. The methods may include simple, user-friendly, automated methods that may be utilized by both expert and non-expert users. The methods may include acquiring sensor data, automatically defining an approximate endpoint period, automatically analyzing the data, automatically determining a set of potential endpoint signatures, and automatically importing an optimal endpoint algorithm into production.

In the prior art, due to the sheer volume of data, a single human may not be able to feasibly analyze all signals within a reasonable time period. Unlike the prior art, the analysis, in an embodiment, may involve little or no human involvement. Instead, an algorithm engine may be employed to perform the analysis, in an embodiment. Since the data are being analyzed automatically instead of manually, more data may be analyzed, if not all. In an embodiment, all possible signals may be analyzed and each signal may be characterized in term of its relevance in being a potential endpoint signature. In addition, since the analysis is now being performed by the algorithm engine, the analysis is no longer limited to data files from a single substrate. Thus, more data may be analyzed to construct a set of robust optimal endpoint algorithms.

The algorithm engine may be a software program that is based on a function of time relative to a target region for an endpoint (e.g., endpoint domain). Once the user has defined an approximate endpoint region (e.g., endpoint domain), the algorithm engine may be employed to analyze the data to discover a set of optimal endpoint signatures.

In an embodiment, the algorithm engine may identify a set of potential shapes that may represent the potential endpoint signatures in a multi-variate analysis. Unlike the prior art, the user is not require to have prior knowledge of the shape for each potential endpoint signature (e.g., peak, valley, step, etc.). Instead, the algorithm engine may generate a list of potential shapes once the algorithm engine has identified the potential endpoint signatures. Thus, the potential endpoint algorithms that may be identified by the algorithm engine are not limited to a single shape (e.g., curve). In an embodiment, the algorithm engine is configured to perform data conditioning and testing of known endpoint candidates in order to identify the best endpoint signatures for a process. The variability of each parameter as a function of time may be derived by performing a stepwise regression to determine the slope of each data input parameter in a series of finite time intervals throughout the history of the process. In an embodiment, the time intervals used in the slope calculation may be set to reject noise in the incoming data and also to reject slow drifts in the data that are not associated with the endpoint.

In an embodiment, OES signals may be grouped according to the degree of change (i.e., slope) that is seen in the variability as the process evolves. In an example, contiguous wavelengths with similar slope variance may be grouped together. By slope-based grouping of the OES signals, the number of signals that may need to be analyzed and the noise in those signals may be greatly reduced. The result may represent a list of signals and group of signals that are most likely to contain information related to the endpoint.

In an embodiment, culling may be performed to reduce the number of potential endpoint signatures. In an embodiment, a robust endpoint signature is one that is present in all processed substrates. In an example, if an endpoint signature is not a feature in all or a substantial majority of test substrates, then the endpoint signatures is not robust and may be eliminated. However, if an endpoint signature appears on a control substrate, the endpoint signature may also be eliminated since a control substrate is a substrate that has not been etched and therefore should not have produced an endpoint signature.

In an embodiment, multi-variate analysis may be performed. In an example, the results from the analysis may be utilized as input into a Partial Least Squares Discriminant Analysis (PLS-DA) in order to optimize weighting of each individual signal in each slope-based group. In an embodiment, instead of requiring the user to enter an expected shape of the endpoint curve (as required by the prior art), the PLS-DA may rely on the target region for the endpoint and the shapes provided by the algorithm engine.

In an embodiment, the results from the PLS-DA from OES signals may be banded and combined with other sensor signals. In an embodiment, the PLS-DA may be repeated with the new set of banded signals to produce a compact optimized combination of potential endpoint signatures that may have a high contrast and a low computational load for real-time endpoint calculation.

In an embodiment, the potential endpoint signatures are converted into endpoint algorithms with minimal possible delay time. Potential endpoint signatures that can not be converted into real-time endpoint algorithms with minimal real time-delay may be eliminated. In other words, a real-time endpoint algorithm may be discarded if the real-time delay associated with the algorithm exceeds the maximum allowable real-time delay.

In an embodiment, the potential endpoint algorithms may be ranked based on a ratio of useful information to the information that is irrelevant and/or on real-time delay, hereinafter referred to as a fidelity ratio. In an example, an algorithm with a high fidelity ratio and a low real-time delay is considered a more robust algorithm. Once the ranking has been performed, one of the real-time endpoint algorithms may be selected and moved into production.

The features and advantages of the present invention may be better understood with reference to the figures and discussions that follow.

Figure 2:
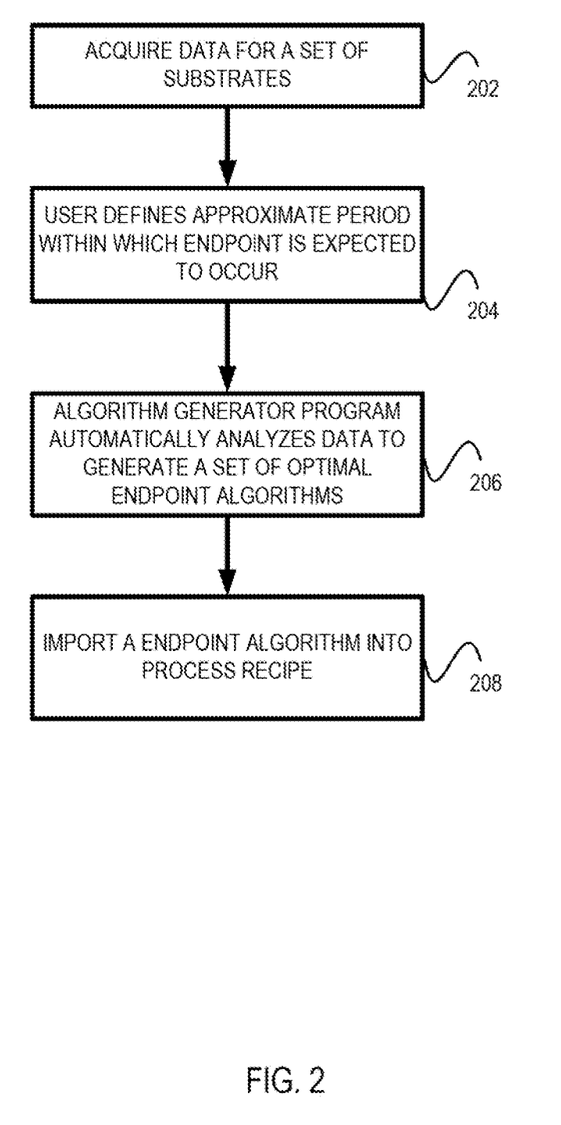
FIG. 2 shows, in an embodiment of the invention, a simple flow chart illustrating a method for constructing an endpoint algorithm.

FIG. 2 shows, in an embodiment of the invention, a simple flow chart illustrating a method for constructing an endpoint algorithm.

At a first step 202, data is acquired by a set of sensors within the processing chamber. Consider the situation wherein, for example, a test substrate is being processed. While the substrate is being processed, data (such as optical emission, electrical signals, pressure data, plasma data, and the like) are being collected by a set of sensors.

In an embodiment, the data that is to be utilized in creating the optimal endpoint algorithm may be coming from more than one test substrate. By incorporating data from different test substrates, noise that is associated with the material differences or process variabilities between the substrates may be eliminated. In an embodiment, the data may be coming from test substrates that may be processed within different chambers. By incorporating data from different chambers, noise that is associated with the differences between chambers may also be eliminated.

At a next step 204, an approximate time period within which the endpoint for the process is expected to occur is identified. In other words, an endpoint domain is defined. Unlike the prior art, the endpoint domain is an approximate and relatively broad time interval within which the algorithm engine is to search for valid endpoint signatures. For example, because of the high speed of the search the user can expand the endpoint domain to incorporate some of what, in the prior art, would have been the pre-endpoint domain. By so doing the algorithm engine can identify endpoint signatures that might occur earlier in the process. These early endpoints reduce the risk of the process damaging underlying semiconductor layers.

At a next step 206, an algorithm engine is activated to perform data analysis and to generate a set of optimal endpoint algorithms. In an embodiment, since the data analysis is not being performed manually, data files from more than one substrate may be analyzed. Those skilled in the art are aware that an endpoint algorithm constructed from data files from multiple substrates, although involving a larger quantity of data, tends to be more robust since endpoint features that are not commonly found in the substrates being analyzed may be eliminated.

Figure 3A:
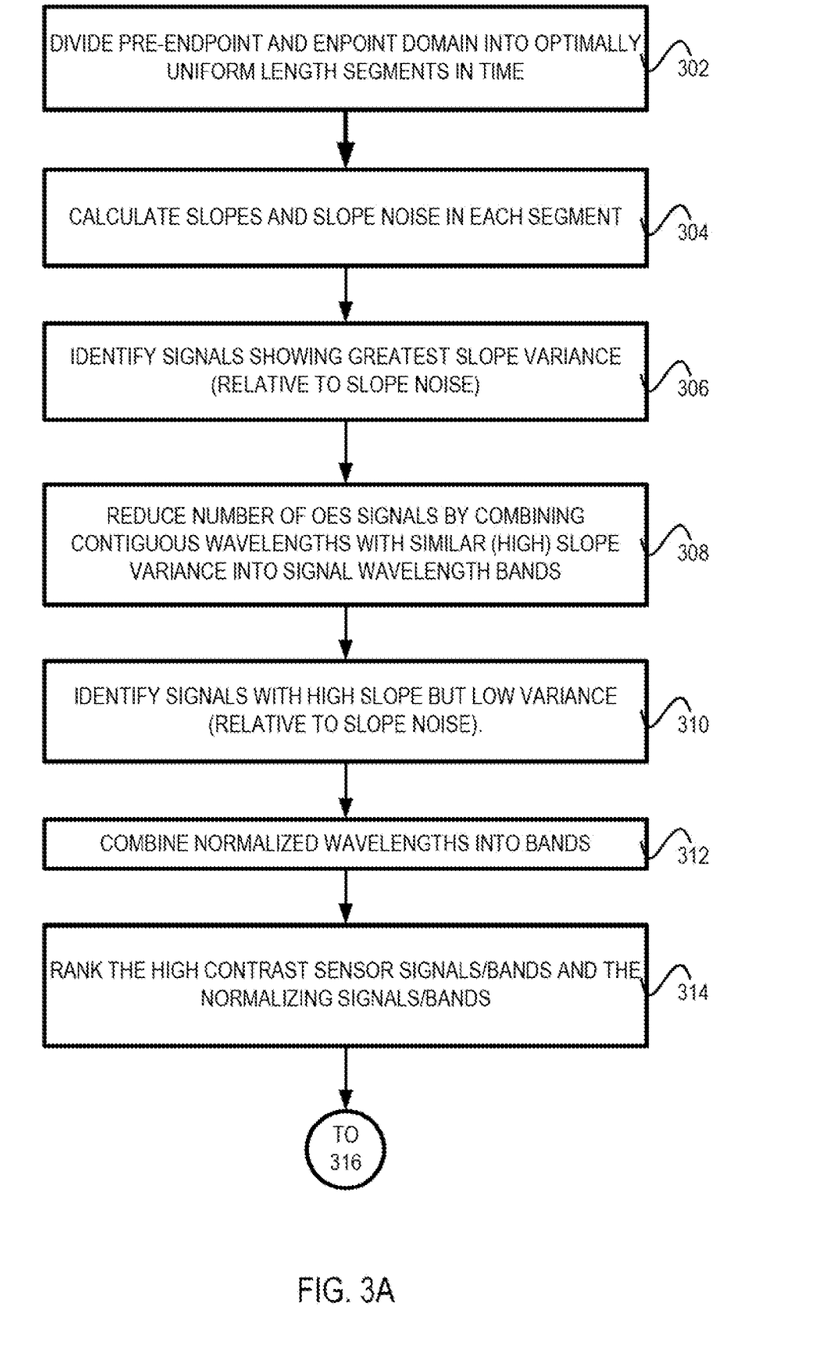
FIGS. 3A and 3B show, in an embodiment of the invention, a simple flow chart illustrating the steps an algorithm engine may execute in discovering the optimal endpoint algorithm.
Figure 3B:
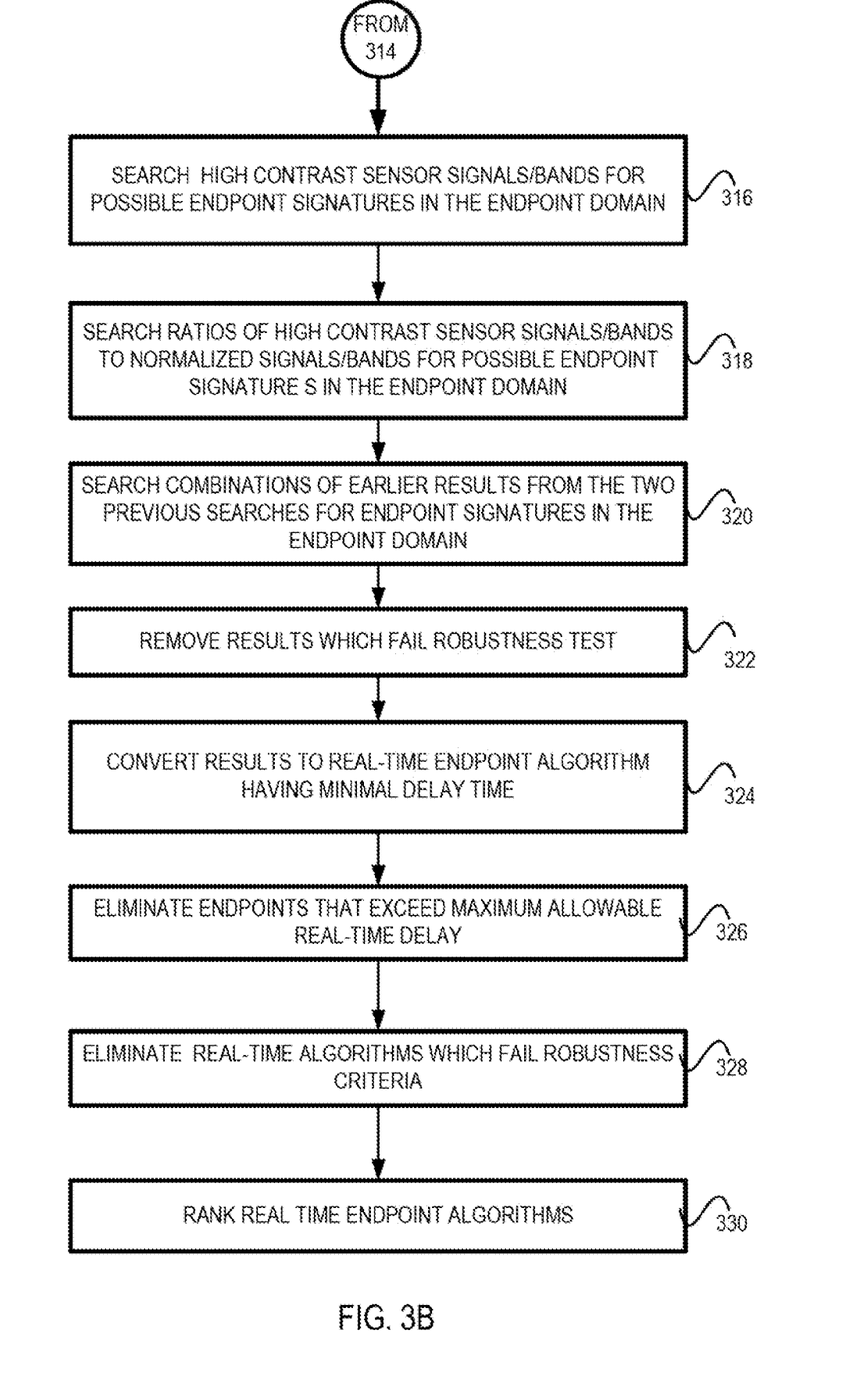
Figure 5:
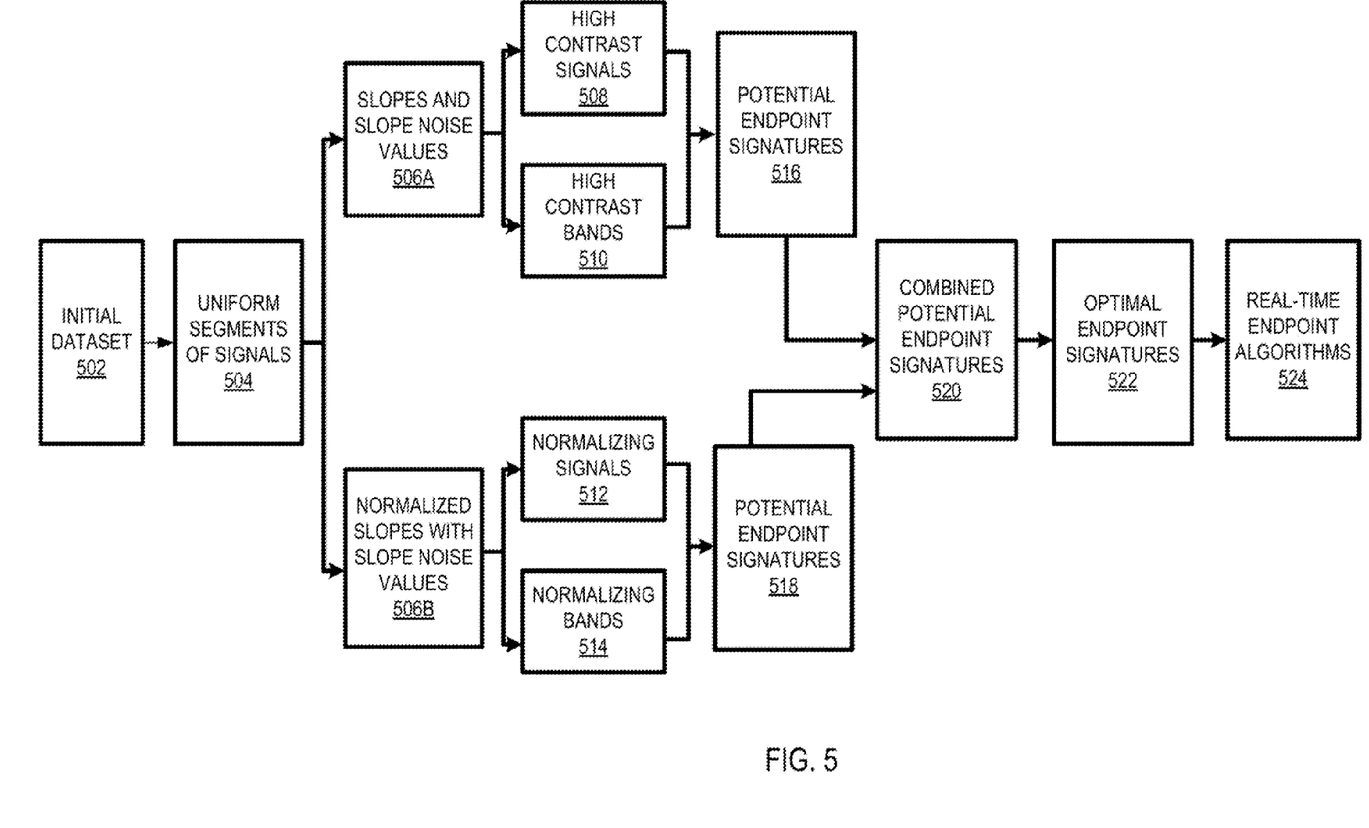
FIG. 5 shows, in an embodiment of the invention, a block diagram illustrating an example of an evolution of data sets into a list of optimal endpoint algorithms.

FIGS. 3A and 3B show, in an embodiment of the invention, a simple flow chart illustrating the steps an algorithm engine may execute in analyzing the data sets and generating a list of optimal endpoint algorithms. To facilitate discussion, FIGS. 3A and 3B will be discussed in conjunction with FIG. 5. FIG. 5 shows a block diagram illustrating an example of an evolution of data sets into a list of optimal endpoint algorithms, in an embodiment.

At a first step 302, the algorithm engine may perform linear fitting on the available data sets (initial data group 502). In other words, each signal may be divided into uniform segments based on time intervals (data group 504). In order to minimize noise and to maximize the potential for identifying the endpoint features, the length of the segments is important. If the segment length is too long, the endpoint may be averaged out and the endpoint may be missed. If the segment is too short, the slope (as described later in step 304) may be affected by noise. In an embodiment, a minimal and maximum number for the segment length may be predefined. In an embodiment, the minimum segment length is longer than a $\frac{1}{10}$ of a second. In another embodiment, the maximum segment length is shorter than 2 seconds for data collected at 10 Hz.

At a next step 304, the algorithm engine may calculate a slope and its corresponding slope noise value (uncertainty in the fit from the slope) for each segment. In an example, if signal A has been divided into ten segments, ten slopes and slope noise values may be determined for signal A (data group 506A). In an embodiment, the slope noise values may be employed to normalize the slopes (data group 506B).

Additionally or alternatively, the algorithm engine may perform a multi-variate analysis (such as a partial least square analysis) utilizing the slopes scaled by the slope noise values as inputs to generate an additional list of slopes and slope noise values based on signals from a combination of sensor channels (also included in data group 506A). In an embodiment, slope noise values may be employed to normalize the slopes (also included in data group 506B).

Once a list of slopes and slope noise values for each segment has been created (data group 506A), at a next step 306, the algorithm engine may identify signal candidates that may be carrying endpoint data. In an example, the algorithm engine may analyze each signal (and its segments) to quantify the amount of variation in the slope for each signal. One method for quantifying the variability in a slope may include calculating the standard deviation of the normalized slope. In an example, a high standard deviation may represent a signal with changes occurring in the slope. In this example, a high standard deviation may represent a signal that may be carrying potential endpoint data. Thus, signals with a high slope variance (relative to slope noise) may be identified as signal candidates (data group 508).

Since OES data may include a high volume of wavelength measurements (at least 2,000 signals), the algorithm engine may reduce the number of OES signals by combining contiguous wavelengths with similar slope variance into signal wavelength bands (data group 510), at a next step 308. In an example, if there are 100 wavelength measurements between 255 nanometers and 280 nanometers and the wavelength measurements have similar slope variance, then the 100 wavelength measurements may be combined into a single signal wavelength band and may be treated as a single unit during the analysis. For example, if there are 2,000 wavelength measurements, then only 10 signal wavelength bands may have to be analyzed. By grouping the wavelength measurements, computational loads may be reduced since the numbers of items that have to be analyzed have been significantly reduced.

At a next step 310, the algorithm engine may identify a list of normalizing signals (data group 506B) that may capture drift and noise in the underlying process. In other words, the algorithm engine may identify signals suitable for normalizing because they have a high slope but low variance (relative to the slope noise). The normalizing signals (data group 512) may represent possible candidates for removing common mode changes (e.g., drift, noise, etc.) in the sensor signals.

At a next 312, the algorithm engine may reduce the number of normalized OES signals by combining contiguous wavelengths with similar slope variance into normalized signal wavelength bands (data group 514). Step 312 is somewhat analogous to step 308 except that step 312 is applied to the normalized OES signals.

At a next step 314, the algorithm may generate a list of high contrast sensor signals (data group 508), high contrast sensor signal wavelength bands (data group 510), normalized signals (data group 512), and normalized wavelength bands (data group 514) for all sensor channels. In an embodiment, the signals within each data set are ranked. Since the possibility of endpoint data within each signal has been quantified, the signals within each data set may be ranked. In an example, a signal with a high slope variance may have a higher ranking than a signal with a low slope variance.

At a next step 316, the algorithm engine may search the high contrast sensor signals and/or bands for possible endpoint signatures within the endpoint domain (data group 516). In an embodiment, an endpoint signature may be identified through a set of class features (peak, valley, inflection, etc.). The set of class features may be predefined, in an embodiment. The set of class features may be searched within the different derivative of the signals.

In an embodiment, filters may be applied to the data groups 508 and 510 in order to remove noise and to smooth out the data. In an embodiment the filters being applied to the data groups may be time symmetric filters. Time symmetric filters utilize equal number of points before and after a particular point to calculate an average value. These filters can only be applied in a post-processing mode rather than during real-time execution of the process. Unlike time asymmetric filters, time symmetric filters tend to introduce minimal time distortion and/or amplitude distortion. As a result, the filtered data may experience minimal real-time delay.

As can be appreciated from the foregoing, each data group may include a plethora of signals. Since each data group has been ranked, in an embodiment, data analysis time may be significantly reduced by reducing the search values. In an example, instead of searching all of the items within data group 508, only the top 10 high contrast sensor signals may be analyzed. The number of items that may be searched may vary. A diminishing return analysis may be performed to determine the optimal number.

At a next step 318, the algorithm engine may search the ratios of high contrast sensor signals/bands (data groups 508 and 510) to normalizing sensors/bands (data groups 512 and 514) for possible endpoint signatures (data group 518) within the endpoint domain. By taking a ratio of the each high contrast sensors signal/band to each normalizing sensor/band, the possible endpoint signatures that may be identified may have a higher fidelity ratio.

At a next step 320, the algorithm engine may search the data results (data groups 516 and 518) to rank combinations (data group 520). In other words, matching is performed to combine endpoint signatures with similar shapes and time period in order to improve contrast and SNR. In an embodiment, linear combination is performed within the same derivative. In other words, a peak that occurs in the first derivate may not be combined with a peak that occurs in the second derivative even though both may be occurring within the same time interval.

At a next step 322, the algorithm engine may perform a robustness test to remove potentially non-repeatable endpoint signatures. In an embodiment, the robustness test may check for consistency across multiple substrates. In an example, if the potential endpoint signature is not consistent across multiple substrates, the potential endpoint signature may be discarded since the potential endpoint signature may be a result of noise/drift, for example.

In another example, the robustness test may check for similarity between test substrates and a control substrate (or a set of control substrates). Consider the situation wherein, for example, the test substrates are substrates with resist mask with one portion being an exposed silicon area. The control substrate may have the same characteristic as the test substrates except the control substrate may be totally covered by a resist mask. Both the test substrates and the control substrate may undergo the same substrate processing. However, since the entire surface of the control substrate is covered with a resist mask, the control substrate should show no sign of etching. Accordingly, the control substrate should have no endpoint. Thus, if a change on the control substrate matches one of the potential endpoint signatures, the matched potential endpoint signature is discarded.

In yet another example, the robustness test may include testing for uniqueness. In an example, the potential endpoint signature being tested has a peak feature. The rest of the signal may be analyzed to determine if another peak feature is occurring before or after the occurrence of the potential endpoint signature. If another peak is identified, the potential endpoint signature is eliminated.

The aforementioned are examples of different robustness criteria that may be applied to eliminate the signatures that may not be real endpoint signatures. By applying a robustness test to the potential endpoint signatures, the list of potential endpoint signatures that may be actual endpoints may be further solidified.

In an embodiment, the algorithm engine may perform a multi-variate correlation analysis, such as a correlation-based partial least square discriminate analysis (PLS-DA) to optimize the list of potential endpoint signatures. As previously mentioned, a multi-variate analysis (such as a correlation-based PLS analysis) usually requires the shape of the endpoint signature to be defined. In other words, the multi-variate analysis needs to know the desired shape of the signature curve. In the prior art, the user is usually the one who has to provide the shape (e.g., peak, valley, slope, etc.) of the endpoint signature. Given that a determination of the shape of an endpoint candidate (in the prior art) may take hours, if not weeks, the user may normally only be able to provide one shape feature as an input into the multi-variate analysis. Unlike the prior art, the potential endpoint signatures as identified by the algorithm engine may have different shape features. As a result, the number of inputs that may be entered in the multi-variate correlation analysis may depend upon the shapes of the potential endpoint signatures that may have been identified.

In an embodiment, the shape/shapes (as determined by the list of potential endpoint signatures) may be correlated against each signal to generate a correlation matrix between the potential endpoint signature and the signals within each sensor channel. The correlation matrix may include optimal weights and/or loads that may be applied to every signal to maximize the contrast in each potential endpoint signature. Although the multi-variate analysis may help optimize the list of potential endpoint signatures (data group 522), a multi-variate correlation analysis is not required to identify a list of optimal endpoint algorithms. Also, even though a correlation-based PLS analysis is utilized in the aforementioned example, this invention is not limited to a correlation-based PLS analysis but may be any type of correlation-based multi-variate analysis.

At a next step 324, the algorithm engine may convert the remaining potential endpoint signatures (data group 522) into real-time endpoint algorithms (data group 524) with minimal real-time delay. In other words, the algorithm engine is configured to convert the potential endpoint signatures into endpoint algorithms that may be executed during production with minimal real-time delay. In an embodiment, settings that may be required by each endpoint algorithm may be calculated automatically. In an example, the settings for real-time filters may be automatically optimized to call an endpoint on every processed test substrate with minimal filter delay. The real-time filters may be cascaded and may use initialization of the cascade memory components to minimize the initial transients that occur with infinite impulse response filters. This is particularly important in endpoint algorithms that may have an endpoint close to the start of the data history.

For each potential endpoint signature, the algorithm engine may provide a real-time endpoint algorithm. In an embodiment, if the algorithm engine is unable to construct a real-time endpoint algorithm then no endpoint algorithm is provided. In an example, if the algorithm engine is unable to construct a real-time endpoint algorithm that is able to call/identify an endpoint on every processed test substrate, then no endpoint algorithm may be provided.

At a next step 326, the algorithm engine may eliminate endpoint algorithms that may exceed the maximum allowable real-time delay. In an example, if the time required to identify an endpoint may exceed a predefined threshold, the endpoint algorithm may be eliminated since the real-time delay may result in over-etched substrates during production.

At a next step 328, the algorithm engine may eliminate real-time endpoint algorithms that do not pass a set of robustness criteria. An example of a robustness criterion may include identifying endpoints on all test substrates with minimal real-time delay. In other words, each endpoint algorithm may be required to identify endpoint on all test substrates. Another example of a robustness criterion may include not identifying endpoint on a control substrate. In other words, if an endpoint algorithm is able to identify an endpoint on a control substrate, the endpoint algorithm is not robust and the endpoint algorithm may be discarded.

At a next step 330, the algorithm engine may rank the real-time endpoint algorithms. In an embodiment, the ranking may be based on the fidelity ratio and/or on real-time delay. In an example, if two real-time endpoint algorithms have the same fidelity ratio then the endpoint algorithm with the smaller real-time delay is ranked higher. In another example, if two endpoint algorithms have the same real-time delay then the endpoint algorithm with the higher fidelity ratio may have a higher rank.

Referring back to FIG. 2, at a next step 208, a real-time endpoint algorithm may be moved into production. In an embodiment, the real-time endpoint algorithm that has the highest ranking may be automatically moved into production. In another embodiment, the real-time endpoint algorithm that may be moved into production may be user-controlled, thereby enabling the user to choose the endpoint algorithm that may best meet his needs. In an example, real-time delay is a concern of a device manufacturer. For this reason, the device manufacturer may prefer to have a less robust endpoint algorithm if a shorter delay time may be provided.

Empirical evidence shows that by automating the process, the task of creating an optimal real-time endpoint algorithm may be performed in a few minutes. Further, since the algorithm engine is configured to perform the analysis with minimal input from a human, the process of constructing an endpoint algorithm may now be performed by non-expert users. Accordingly, if the method fails to produce an acceptable list of endpoint algorithms given an endpoint domain, the user may quickly redefine the endpoint domain and rerun the algorithm engine to generate a new list of endpoint algorithms within a few minutes.

Figure 4:
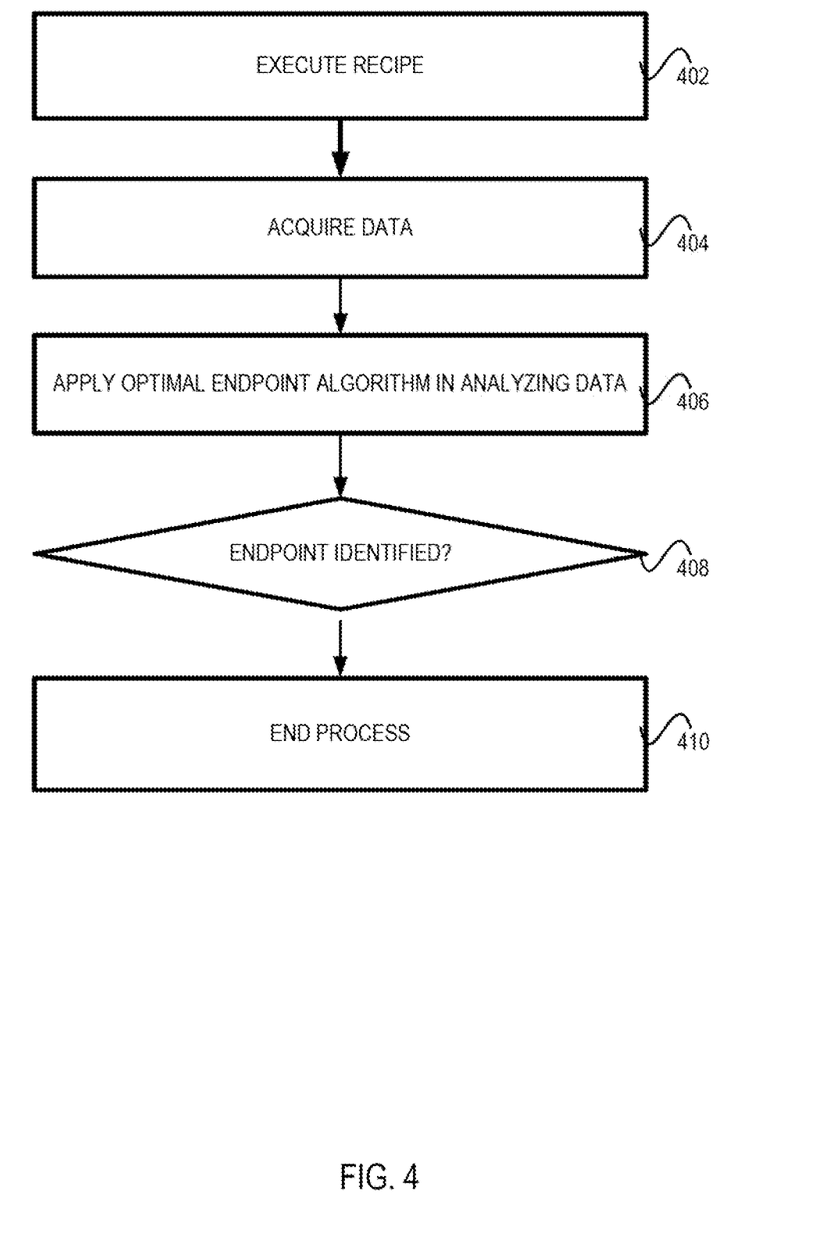
FIG. 4 shows, in an embodiment of the invention, a simple flow chart for implementing the optimal endpoint algorithm within a production environment.

FIG. 4 shows, in an embodiment of the invention, a simple flow chart for implementing a real-time endpoint algorithm in a production environment.

At a first step 402, a recipe may be executed.

At a next step 404, data may be acquired during substrate processing by a set of sensors.

At a next step 406, an endpoint algorithm may be employed in-situ to analyze the data to identify the process endpoint. In an embodiment, a computing engine may be employed to analyze the data. Since a high volume of data may be collected, the computing engine may be a fast processing module that may be configured to handle a large volume of data. The data may be sent directly from the sensor without first having to go through the fabrication host controller or even the process module controller. Application Ser. No. 12/555,674, filed on Sep. 8, 2009, by Huang et al. describes an example analysis computer suitable for performing the analysis.

At a next step 408, the system may make a determination about the endpoint being identified.

If an endpoint has not been identified, then the system may return to step 404.

However, if the endpoint has been identified, then at a next step 410, the recipe may be stopped.

As can be appreciated from the forgoing, one or more embodiments of the present invention provide for methods for identifying an optimal real-time endpoint algorithm. By automating the analysis, the methods essentially eliminate the need for an expert user. With the methods as described herein, a more robust endpoint algorithm may be moved into production. Also, since the time required for creating an endpoint algorithm has been significantly reduced, a updating or creating new endpoint algorithm is no longer a resource-intensive and time-consuming task.

While this invention has been described in terms of several preferred embodiments, there are alterations, permutations, and equivalents, which fall within the scope of this invention. Although various examples are provided herein, it is intended that these examples be illustrative and not limiting with respect to the invention. Also, even though endpoint is used as an example throughout this document, the invention may also be applied toward change point, which is a signal changing event that may occur during processing.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for automatically identifying an optimal endpoint algorithm for qualifying a process endpoint during substrate processing within a plasma processing system, comprising:

receiving sensor data from a plurality of sensors during substrate processing of at least one substrate within said plasma processing system wherein said sensor data includes a plurality of signal streams from a plurality of sensor channels;

identifying an endpoint domain, wherein said endpoint domain is an approximate period within which said process endpoint is expected to occur;

analyzing said sensor data to generate a set of potential endpoint signatures;

converting said set of potential endpoint signatures into a set of optimal endpoint algorithms; and importing one optimal endpoint algorithm of said set of optimal endpoint algorithms into production environment, wherein said analyzing of said sensor data includes performing linear fitting on said sensor data to divide each signal stream from said plurality of signal streams into a plurality of segments based on time intervals.

2. The method of claim 1 wherein each segment of said plurality of segments is uniform.

3. The method of claim 1 wherein said analyzing of said sensor data to generate a first set of potential endpoint signatures of said set of potential endpoint signatures includes calculating a first set of slopes and a first set of corresponding slope noise values for said sensor data, wherein a slope and a corresponding slope noise value is calculated for each segment of said plurality of segments, calculating slope variances in each slope to identify a set of high contrast signals from said plurality of signal streams, wherein said set of high contrast signals having high slope variance, combining contiguous wavelengths with similar slope variance into a set of signal wavelength bands, ranking said high contrast signals, ranking said set of signal wavelength bands, and identifying said first set of potential endpoint signatures by applying a set of class features to at least part of said high contrast signals and said set of signal wavelength bands, wherein said set of class features include at least one of peak, valley, and inflection.

4. The method of claim 3 wherein said analyzing of said sensor data to generate a second set of potential endpoint signatures of said set of potential endpoint signatures includes performing a multi-variate analysis by combining slopes scaled by corresponding slope noise values of said first set of slopes and said first set of corresponding slope noise values to generate a normalized set of slopes and a normalized set of corresponding slope noise values, calculating slope variances in said normalized set of slopes to identify normalizing signals from said plurality of signal streams, wherein said normalizing signals having high slope and low variance, combining contiguous wavelengths with similar slope variance into a set of normalizing signal wavelength bands, ranking said normalizing a signals, ranking said set of normalizing signal wavelength bands, and applying a set of class features to a ratio of said high contrast signals and a set of signal wavelength bands to said normalizing signals and said set of normalizing signal wavelength bands to generate said second set of potential endpoint signatures.

5. The method of claim 3 wherein said converting of said set of potential endpoint signatures into said set of optimal endpoint algorithms includes combining a first potential endpoint signature and a second potential endpoint signature of said set of potential endpoint signatures if said first potential endpoint signature and said second potential endpoint signature having similar shapes and time period, performing a robustness test to remove potentially non-repeatable endpoint signatures from said set of potential endpoint signatures, performing a multi-variate correlation analysis to identify a set of optimal endpoint signatures of said set of potential endpoint signatures, converting said set of optimal endpoint signatures into a set of real-time endpoint algorithms with minimal real-time delay, wherein said real-time delay being based on filter delay, generating said set of optimal endpoint algorithms by performing at least one of
  removing real-time endpoint algorithms with corresponding real-time delay greater than a predefined threshold, and
  eliminating said real-time endpoint algorithms if said real-time endpoint algorithms fail to pass a robustness test, and
ranking each optimal endpoint algorithm of said set of optimal endpoint algorithms, wherein said ranking being based on at least one of fidelity ratio and said real-time delay.

6. The method of claim 4 wherein said converting of said set of potential endpoint signatures into said set of optimal endpoint algorithms includes
  combining a first potential endpoint signature and a second potential endpoint signature of said set of potential endpoint signatures if said first potential endpoint signature and said second potential endpoint signature having similar shapes and time period,
  performing a robustness test to remove potentially non-repeatable endpoint signatures from said set of potential endpoint signatures,
  performing a multi-variate correlation analysis to identify a set of optimal endpoint signatures of said set of potential endpoint signatures,
  converting said set of optimal endpoint signatures into a set of real-time endpoint algorithms with minimal real-time delay, wherein said real-time delay being based on filter delay,
  generating said set of optimal endpoint algorithms by performing at least one of
    removing real-time endpoint algorithms with corresponding real-time delay greater than a predefined threshold, and
    eliminating said real-time endpoint algorithms if said real-time endpoint algorithms fail to pass a robustness test, and
  ranking each optimal endpoint algorithm of said set of optimal endpoint algorithms, wherein said ranking being based on at least one of fidelity ratio and said real-time delay.

7. The method of claim 1 wherein said importing of said optimal endpoint algorithm being based on at least one of ranking and a set of user-defined conditions.

8. The method of claim 1 wherein said sensor data is being gathered from more than one substrate.

9. A method for qualifying an endpoint during substrate processing within a processing chamber, comprising:
  executing a recipe on a substrate;
  receiving processing data from a set of sensors during substrate processing;
  analyzing said processing data by applying an optimal endpoint algorithm;
  identifying a process endpoint;
  stopping said substrate processing wherein said optimal ending algorithm is constructed by receiving sensor data from a plurality of sensors during processing of at least one substrate within a plasma processing system, said sensor data includes a plurality of signal streams from a plurality of sensor channels, identifying an endpoint domain, wherein said endpoint domain is an approximate period within which said process endpoint is expected to occur, analyzing said sensor data to generate a set of potential endpoint signatures, converting said set of potential endpoint signatures into a set of optimal endpoint algorithms, importing one optimal endpoint algorithm of a set of optimal endpoint algorithms into production environment, said sensor data is being gathered from more than one substrate, said analyzing of said sensor data includes performing linear fitting on said sensor data to divide each signal stream from said plurality of signal streams into a plurality of segments based on time intervals.

10. The method of claim 9 wherein said analyzing of said sensor data to generate a first set of potential endpoint signatures of said set of potential endpoint signatures includes
  calculating a first set of slopes and a first set of corresponding slope noise values for said sensor data, wherein a slope and a corresponding slope noise value is calculated for each segment of said plurality of segments,
  calculating slope variances in said first set of slopes to identify a set of high contrast signals from said plurality of signal streams, wherein said set of high contrast signals having high slope variance,
  combining contiguous wavelengths with similar slope variance into a set of signal wavelength bands,
  ranking said high contrast signals,
  ranking said set of signal wavelength bands, and
  identifying said first set of potential endpoint signatures by applying a set of class features to at least part of said high contrast signals and said set of signal wavelength bands, wherein said set of class features include at least one of peak, valley, and inflection.

11. The method of claim 10 wherein said analyzing of said sensor data to generate second set of potential endpoint signatures of said set of potential endpoint signatures includes
  performing a multi-variate analysis by combining slopes scaled by corresponding slope noise values of said first set of slopes and said first set of corresponding slope noise values to generate a normalized set of slopes and a normalized set of corresponding slope noise values,
  calculating slope variances in said normalized set of slopes to identify normalizing signals from said plurality of signal streams, wherein said normalizing signals having high slope and low variance,
  combining contiguous wavelengths with similar slope variance into a set of normalizing signal wavelength bands,
  ranking said normalizing signals,
  ranking said set of normalizing signal wavelength bands, and
  applying a set of class features to a ratio of said high contrast signals and a set of signal wavelength bands to said normalizing signals and said set of normalizing signal wavelength bands to generate said second set of potential endpoint signatures.

12. The method of claim 10 wherein said converting of said set of potential endpoint signatures into said set of optimal endpoint algorithms includes
  combining a first potential endpoint signature and a second potential endpoint signature of said set of potential endpoint signatures if said first potential endpoint signature and said second potential endpoint signature having similar shapes and time period,
  performing a robustness test to remove potentially non-repeatable endpoint signatures from said set of potential endpoint signatures,
  performing a multi-variate correlation analysis to identify a set of optimal endpoint signatures of said set of potential endpoint signatures, converting said set of optimal endpoint signatures into a set of real-time endpoint algorithms with minimal real-time delay, wherein said real-time delay being based on filter delay, generating said set of optimal endpoint algorithms by performing at least one of removing real-time endpoint algorithms with corresponding real-time delay greater than a predefined threshold, and eliminating said real-time endpoint algorithms if said real-time endpoint algorithms fail to pass a robustness test, and ranking each optimal endpoint algorithm of said set of optimal endpoint algorithms, wherein said ranking being based on at least one of fidelity ratio and said real-time delay.

13. The method of claim 11 wherein said converting of said set of potential endpoint signatures into said set of optimal endpoint algorithms includes combining a first potential endpoint signature and a second potential endpoint signature of said set of potential endpoint signatures if said first potential endpoint signature and said second potential endpoint signature having similar shapes and time period, performing a robustness test to remove potentially non-repeatable endpoint signatures from said set of potential endpoint signatures, performing a multi-variate correlation analysis to identify a set of optimal endpoint signatures of said set of potential endpoint signatures, converting said set of optimal endpoint signatures into a set of real-time endpoint algorithms with minimal real-time delay, wherein said real-time delay being based on filter delay, generating said set of optimal endpoint algorithms by performing at least one of removing real-time endpoint algorithms with corresponding real-time delay greater than a predefined threshold, and eliminating said real-time endpoint algorithms if said real-time endpoint algorithms fail to pass a robustness test, and ranking each optimal endpoint algorithm of said set of optimal endpoint algorithms, wherein said ranking being based on at least one of fidelity ratio and said real-time delay.

14. The method of claim 9 wherein said importing of said optimal endpoint algorithm being based on at least one of ranking and a set of user-defined conditions.

15. The method of claim 9 wherein each segment of said plurality of segments is uniform.

* * * * *